United States Patent
Shepard et al.

(10) Patent No.: US 9,559,508 B2
(45) Date of Patent: Jan. 31, 2017

(54) HOUSINGS WITH EMBEDDED BUS BARS AND STANDOFFS

(71) Applicant: Hamilton Sundstrand Corporation, Charlotte, NC (US)

(72) Inventors: Charles Shepard, DeKalb, IL (US); Eric Karlen, Rockford, IL (US); John Horowy, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 310 days.

(21) Appl. No.: 14/186,695

(22) Filed: Feb. 21, 2014

(65) Prior Publication Data

US 2015/0101838 A1   Apr. 16, 2015

Related U.S. Application Data

(60) Provisional application No. 61/889,284, filed on Oct. 10, 2013.

(51) Int. Cl.
| | | |
|---|---|---|
| *H02K 5/00* | (2006.01) | |
| *H02G 5/06* | (2006.01) | |
| *H05K 7/20* | (2006.01) | |
| *H01B 1/02* | (2006.01) | |
| *H05K 5/00* | (2006.01) | |
| *H05K 7/14* | (2006.01) | |

(52) U.S. Cl.
CPC ............... *H02G 5/06* (2013.01); *H01B 1/026* (2013.01); *H05K 5/0069* (2013.01); *H05K 7/1432* (2013.01); *H05K 7/20509* (2013.01); *H05K 7/20845* (2013.01); *H05K 7/20854* (2013.01)

(58) Field of Classification Search
CPC ............ H02G 3/08; H02G 3/081; H02G 5/00; H02G 5/06; H02G 5/005; H05K 5/00; H05K 5/02; H05K 5/0069; H05K 7/1432; H05K 7/2509; H05K 7/20845; H05K 7/20854; H05K 7/00; H05K 7/00; H01B 1/026
USPC .......... 174/50, 520, 71 B, 68.2, 88 B, 70 B, 99 B,174/541, 528; 439/76.1, 76.2, 212; 361/611, 361/600, 601, 624, 637, 648, 679.01, 775
See application file for complete search history.

(56) References Cited

U.S. PATENT DOCUMENTS

| | | | | |
|---|---|---|---|---|
| 4,867,696 A | * | 9/1989 | Demler, Jr. ............ | H02G 5/005 174/72 B |
| 6,519,500 B1 | | 2/2003 | White | |
| 6,560,115 B1 | * | 5/2003 | Wakabayashi ....... | H05K 5/0065 174/541 |
| 6,740,814 B2 | * | 5/2004 | Ohta ...................... | H02G 3/088 174/50 |

(Continued)

FOREIGN PATENT DOCUMENTS

| | | |
|---|---|---|
| EP | 0187107 A1 | 7/1986 |
| EP | 2131481 A1 | 12/2009 |

OTHER PUBLICATIONS

Search Report and Opinion issued by the European Patent Office on Apr. 15, 2015 for European Patent Application No. 14186844.

*Primary Examiner* — Angel R Estrada
(74) *Attorney, Agent, or Firm* — Locke Lord LLP; Scott D. Wofsy; Christopher J. Cillié

(57) ABSTRACT

Housing for electrical components includes a housing body, an insulating body and a bus bar. The insulating body is disposed within the housing body and is integral with the housing body. The bus bar is disposed within the within the housing body and embedded in the insulating body. The (Continued)

insulating body and housing body are integral with one another for fixing the bus bar within the housing body.

16 Claims, 4 Drawing Sheets

(56) References Cited

U.S. PATENT DOCUMENTS

| | | | | |
|---|---|---|---|---|
| 7,799,991 | B1 * | 9/2010 | Advey | H01R 13/424 174/50 |
| 8,248,804 | B2 * | 8/2012 | Han | H02S 40/345 174/50 |
| 8,426,752 | B2 * | 4/2013 | Hashikura | H05K 7/20854 174/528 |
| 2006/0044103 | A1 | 3/2006 | Roebke et al. | |
| 2010/0079230 | A1 | 4/2010 | Brubaker et al. | |

\* cited by examiner

HOUSINGS WITH EMBEDDED BUS BARS AND STANDOFFS

CROSS-REFERENCE TO RELATED APPLICATION

This application claims the benefit of priority to U.S. Provisional Patent Application No. 61/889,284 filed on Oct. 10, 2013 and is incorporated by reference herein in its entirety.

BACKGROUND OF THE INVENTION

1. Field of the Invention

The present disclosure relates to electrical assemblies, and more particularly to motor controller housings having integral electrical components 2. Description of Related Art Aircraft electrical systems typically include motor controllers for electrical machines such as generators, motors and actuators. The controllers can be analog or digital, and operate to regulate, convert and/or condition power. They can include devices such as rectifiers, inverters and frequency converters, and generally include one or more controllers mounted on a printed circuit board coupled to the motor controller.

Electrical components housed within the motor controller housing need to be electrically and mechanically secured to form the motor controller assembly. Generally, a structure such as a conductive bus bar is fastened using hardware, e.g. bolted, within the housing and electrically connected to electrical components associated with the motor controller. For example, one or more printed circuit boards can be fastened to the housing and connected to the bus bar through wiring routed through the housing. Other electrical components, such as rectifiers, inverters, and frequency converters associated with the motor controller generally connect electrically with the controller via the bus bar through other wires routed internally within the housing.

Conventional controllers and bus bars arrangements have generally been considered satisfactory for their intended purpose. However, there is a need for motor controllers with fewer parts and that are relatively compact. There also remains a need in the art for controllers that are easy to make and use. The present disclosure provides a solution for these problems.

SUMMARY OF THE INVENTION

A housing for electrical components includes a housing body, and insulating body and a bus bar. The insulating body is disposed within the housing body and integral with the housing body. The bus bar is disposed within the housing body and embedded within the insulating body such that the insulating body, bus bar and housing body are integral with one another for fixing the bus bar within the housing body.

In certain embodiments, the housing includes a cooling body connected to the housing body. The cooling body can be a finned structure configured for cooling the housing using a gaseous coolant flow. A cold plate configured for cooling the housing using a liquid coolant flow can form the cooling body. It is contemplated the housing can include both a finned structure and a cold plate for cooling the housing.

In accordance with certain embodiments, a printed wire board is disposed within the housing body and coupled to the housing body. A standoff embedded in the bus bar can couple the printed wire board to the housing body. The standoff can electrically connect the bus bar to the printed wire board. The standoff can couple the printed wire board to the housing body through the insulating body. A standoff embedded in housing body can couple the printed wire board to the housing body.

It is contemplated that the insulating body define a cavity within which an inductor is embedded within the insulating body. The inductor body can be a C-shaped, E-shaped, toroid-shaped, or other shaped inductor. A conductive coil can be electrically connected to the bus bar and wrap about the inductor body.

A motor controller is also provided. The motor controller includes a housing as described above with a printed wire board disposed within the housing body. A standoff electrically connects the printed wire board to the bus bar and mechanically couples the printed wire board to the housing body through the bus bar and insulating body. The insulating body thermally couples the bus bar to the housing body for cooling the bus bar.

It is contemplated that the housing body and insulating body are integrally formed using an additive manufacturing process. The additive manufacturing process can include a foil layup process using interleaved foils ultrasonically welded to one another. Structures such as PCBs and bus bars can be incorporated during the layup process so as to form embedded structures within the additively manufactured housing. The foil sheets can be formed from different materials such as conductors and insulators. The additive manufacturing process may also include the accumulation of particles accelerated towards a surface at an elevated temperature such as in a cold spray process. The cold spray process can be used to form all or a portion of the device, such as by using a ceramic insulating body suitable for resisting the elevated temperatures associated with cold spray processes. Standoffs for coupling electrical components and subassemblies can be defined in at least one of the bus bar, insulating body and housing body.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
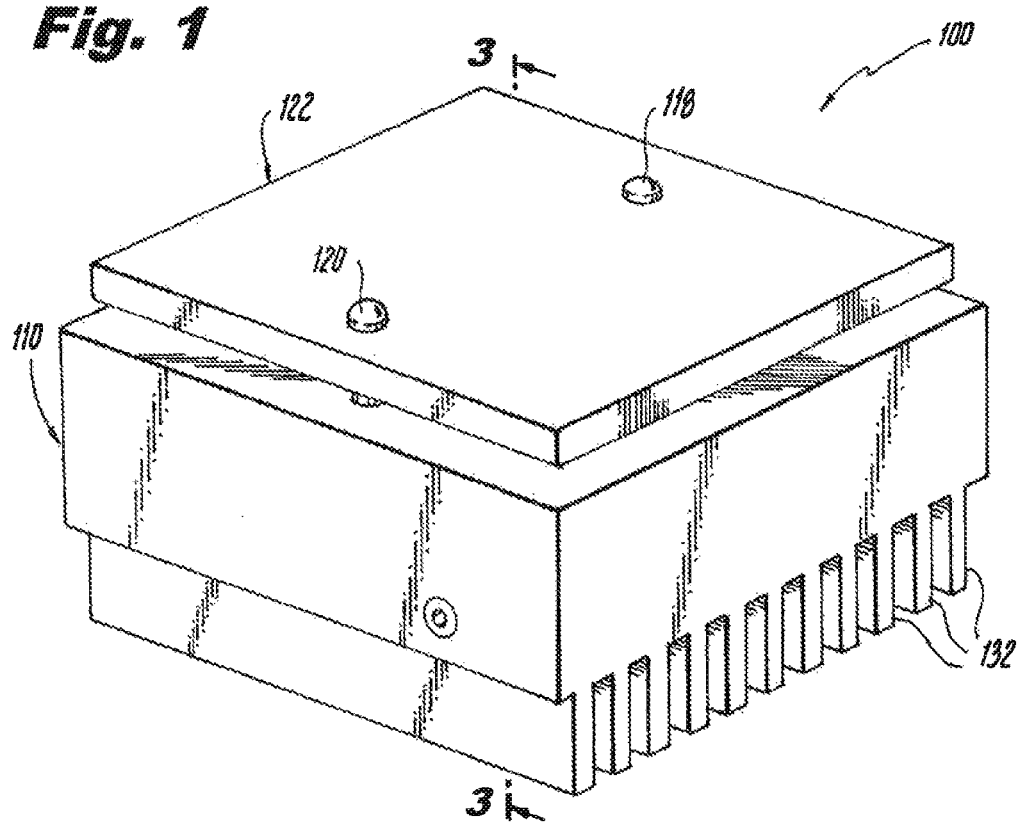
FIG. 1 is a perspective view of a motor controller constructed in accordance with the present disclosure, showing cooling fins and an externally mounted printed circuit board (PCB)

Reference will now be made to the drawings wherein like reference numerals identify similar structural features or aspects of the subject disclosure. For purposes of explanation and illustration, and not limitation, an exemplary embodiment of a motor controller in accordance with the disclosure is shown in FIG. 1 and is designated generally by reference character 100. Other embodiments of the motor controller in accordance with the disclosure, or aspects thereof, are provided in FIGS. 2-8, as will be described. The systems and methods described herein can be used for motor controllers, such as motor controller aircraft starter/generators for example.

Motor controller 100 includes a housing 110, a printed circuit board (PCB) 122, a first PCB standoff 118, and a second PCB standoff 120. Printed circuit board 122 is fixed to housing 110 by first and second PCB standoffs 118 and 120 such that PCB 122 and housing body 112 form a motor controller assembly. Housing body 112 includes a housing body 112 that defines an interior, the interior housing electrical components (shown in FIG. 2) electrically connected to PCB 122 and fixed therein. Housing body 112 also defines a cooling body 132 for cooling housing body 112, cooling body 132 defining cooling fins for cooling with a fluid flow.

First and second PCB standoffs 118 and 120 fix PCB 122 to housing body 112, each respectively extending through housing body 112 and into an interior portion (shown in FIG. 2) of housing body 112. PCB 122 contains circuitry and wiring as suited for providing control functionality to controlled electrical devices such as motors and the like. Although described as a printed circuit board, it will be appreciated that PCB 122 can also be a printed wire board.

Figure 2:
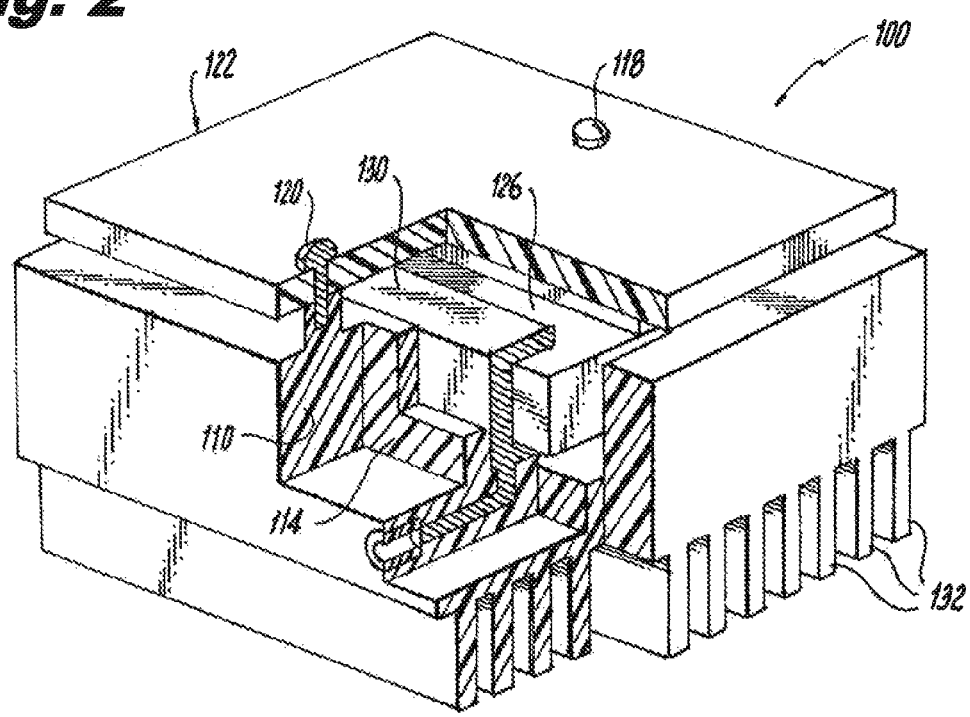
FIG. 2 is a partial cross-sectional perspective view of the motor controller of FIG. 1, showing the insulating body conformally disposed within the housing.

As shown in FIG. 2, housing body 112 houses an inductor body 126, a conductor 130, and an insulating body 114. Insulating body 114 is disposed between interior wall portions of housing 110 and conductor 130. Conductor 130 wraps around inductor body 126, and can be separated from inductor body 126 by insulating body 114. Portions of insulating body 114 and voids (shown in FIG. 3) can also separate inductor body 126 from insulating body 114. Conductor 130 extends from a voltage source terminal and a return terminal for electrically connecting conductor 130 to a power source.

Insulating body 114 is integral with housing body 112 and formed from first material that is electrically insulating, such as plastic or ceramic for example. Housing body 112 is formed from a second material, such as aluminum or aluminum alloy. Conductor 130 is formed from an electrically conductive material, such as copper. Inductor body 126 is formed from a magnetic material, such as ferrite.

Figure 3:
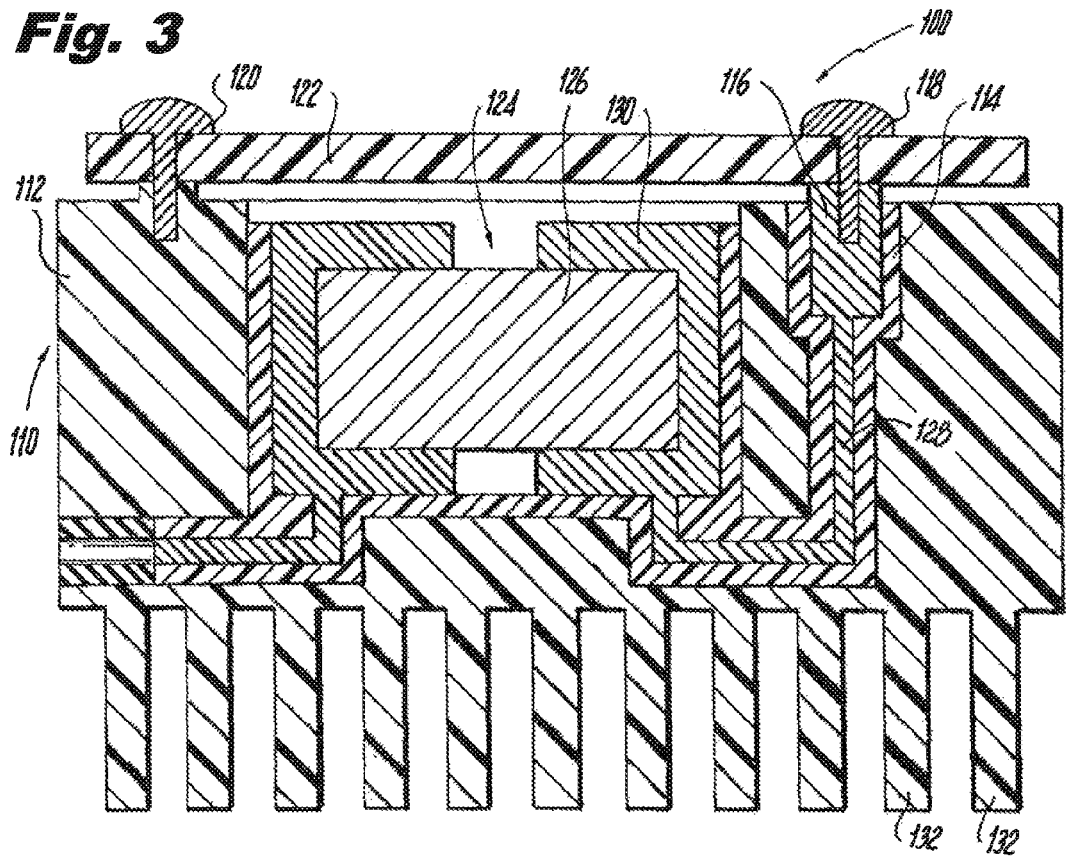
FIG. 3 is a cross-sectional side view of the motor controller of FIG. 1, showing a bus bar conformally embraced by the insulating body.

With reference to FIG. 3, motor controller 100 is shown in cross-section. Inductor body 126 disposed within a passageway 124. Passageway 124 can be defined by either or both of insulating body 114 and housing body 112, and is configured and adapted to receive inductor body 126. As shown, inductor body 126 is a C-shaped inductor body shown laying on its side laterally in FIG. 1 from oriented toward the backside of the inductor. As will be appreciated, other types of conductor bodies such as E-shaped and toroid shaped bodies are possible and within the scope of the present disclosure.

Second standoff 120 extends from PCB 122 and into housing body 112. Second standoff 120 is fixed within housing body 112 and fixedly couples PCB 122 to housing body 112. First standoff 118 is formed from an electrically conductive material and extends into a bus bar 116 integral with housing body 112, thereby electrically coupling PCB 122 with bus bar 116 and fixing PCB 122 to housing body 112. Connecting PCB 122 to housing body 112 with a current standoff, such as second standoff 118, can eliminate the need to run wires between PCBs and bus bars in controllers. It can also reduce the number of parts required by such assemblies by reducing the number of fasteners required to couple the PCB to the housing.

Bus bar 116 is integral with housing body 112. Bus bar 116 also electrically connects with other components integrated into housing 110, such as conductor 128. Conductor 128 is disposed within housing 100 and extends between a first end and second, each end being configured and adapted to connect to respective voltage terminals. Between its connection with bus bar 116 and its second end, conductor 128 wraps around inductor body 126 in at least one loop 130 or winding, and is configured and adapted to filter or condition power flowing through motor controller 100 as suited for the intended application of the device. Insulating body 114 and or passageway 124 electrically isolate conductor 128 from housing body 112, thereby providing a conductive path within motor controller 100. As will be appreciated, passageway 124 can be a cavity enveloped by housing body 112.

Cooling body 132 is connected to housing body 112. Cooling body 132 can be a separate structure, e.g. a substrate, upon which housing body 112 is constructed using an additive manufacturing process. Cooling body 132 is constructed with the same additive manufacturing process as housing body 112.

At least two of housing body 110, insulating body 114, and conductor 130 are integrally formed, such as using an additive manufacturing process. For example, a first portion of housing body 112 can be constructed using an additive manufacturing process. Insulating body 114 can then be added. Bus bar 116 can thereafter be formed using an additive manufacturing process. A second portion of housing body 112 can then be constructed. More than one additive manufacturing process can be used. For example, housing body 112 and bus bar 116 can be constructed using an ultrasonic welding process, and insulating body 114 can be 3D printed. Alternatively, insulating body 114 can be an injection molded assembly inserted in an operation that interrupts the UAM process used to form housing body 112.

UAM allows for two structures can be built up from a substrate by progressively laying up thin sheets of material and ultrasonically welding them together. The resulting structure forms an integral assembly with integral structures with disparate properties determined by the respective properties of the structure's constituent material. UAM provides a method for joining dissimilar through use of sound waves to merge a layup of layers of metal foil. It produces true metallurgical bonds with full density and using a variety of metals, such as aluminum, copper, stainless steel and titanium. The solid-state nature of UAM allows for welding dissimilar metals into an integral assembly, such as a housing where the constituent metals are severable into the constituent components used to build up the structure. This enables cladding of dissimilar metals, and allows for embedding structures such as bus bar 116 within dissimilar structures such as insulating body 114 and housing body 112. This can allow for construction of parts, e.g. motor controller 100, consisting of different materials, shapes, and complexity. The different materials can be formed as an integral assembly having structures discretely composed of a single material, for example an electrical insulator integrally formed with an electrically conductive material fixedly embraced by an enveloping housing.

Figure 4:
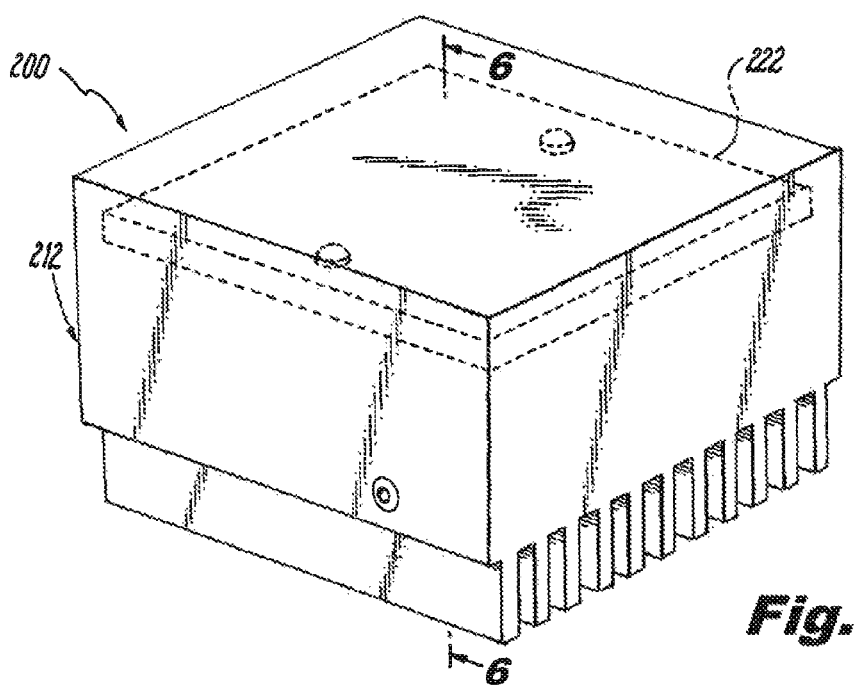
FIG. 4 is a perspective view of another embodiment of a motor controller constructed in accordance with the present disclosure, showing a PCB disposed within the housing.
Figure 5:
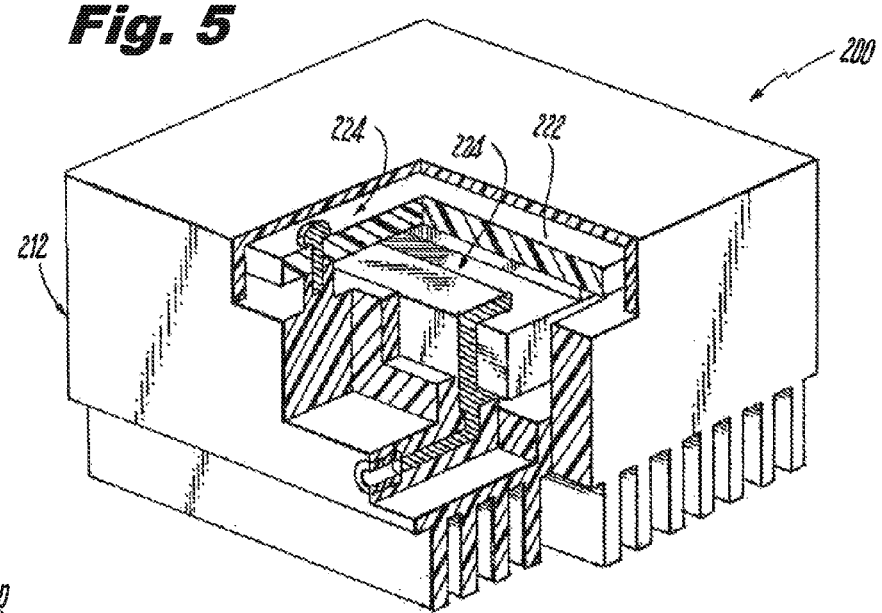
FIG. 5 is a partial cross-sectional perspective view of the motor controller of FIG. 4, showing the PCB coupled to the housing with a standoff.
Figure 6:
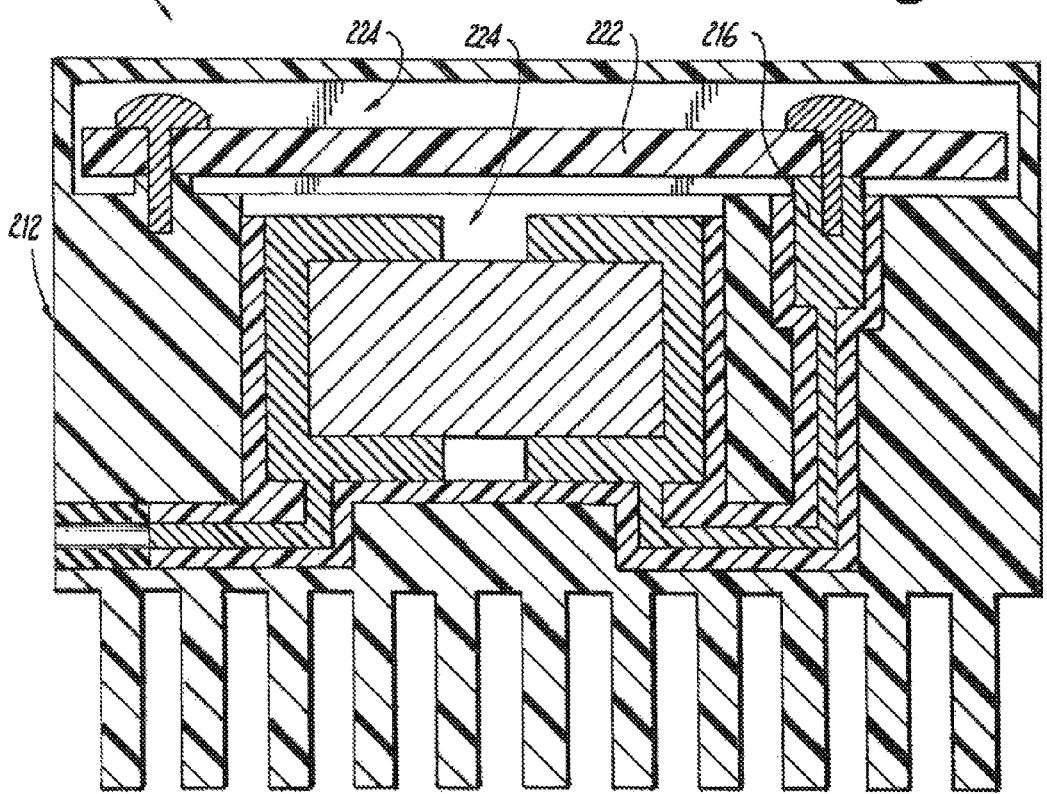
FIG. 6 is a cross-sectional side view of the motor controller of FIG. 4, showing a current standoff coupling the PCB to the bus bar.

With reference to FIGS. 4-6, a motor controller 200 is shown. Motor controller 200 is similar to motor controller 100 and additionally includes a housing body 212 that envelopes PCB 222. Housing body 212 envelopes PCB 222 within a cavity 224. Cavity 224 in turn extends about the periphery and opposing surfaces of PCB 222. Advantageously, PCB 222 can be embedded within motor controller 200 so as to render it physically inaccessible from the environment external to motor controller 200. This can render motor controller 200 tamper-resistant. It can also provide protection from foreign object damage or foreign material that could otherwise short electrified components.

Figure 7:
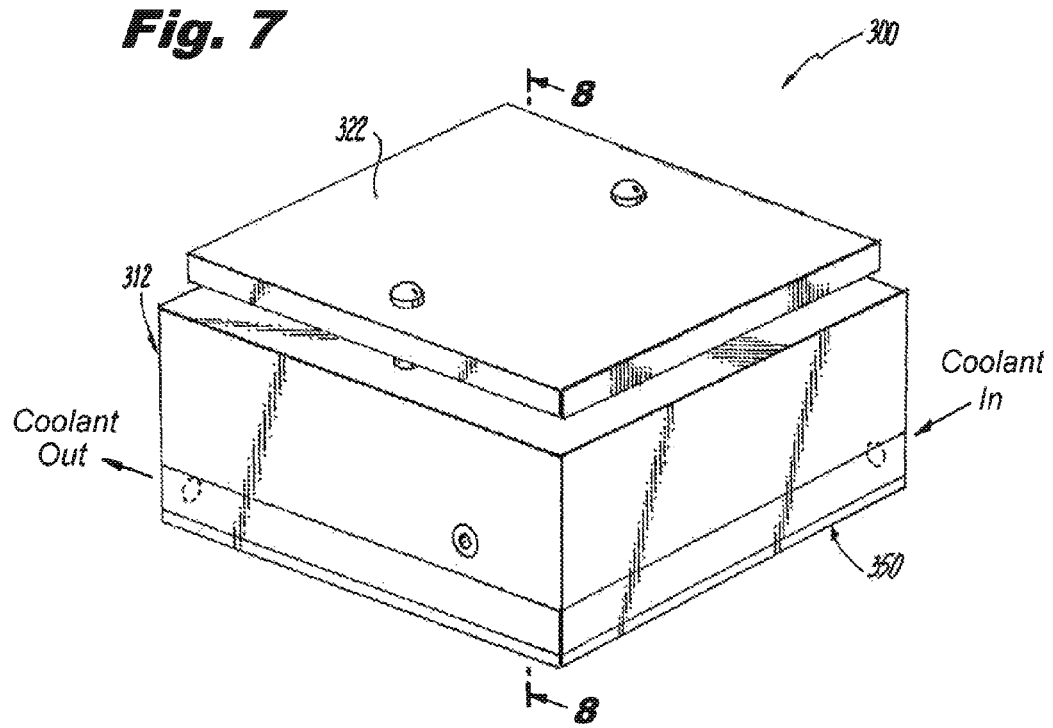
FIG. 7 is a perspective view of yet another embodiment of a motor controller constructed in accordance with the present disclosure, showing a housing formed on a cold plate.
Figure 8:
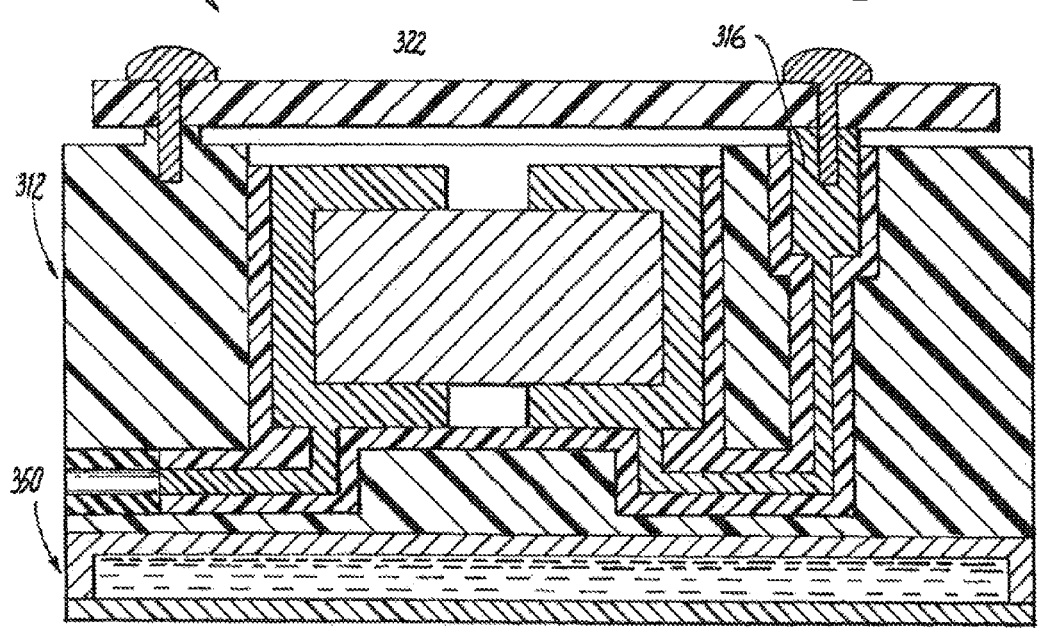
FIG. 8 is a cross-sectional side view of the motor controller of FIG. 7, showing standoffs coupling the PCB to the motor controller housing and bus bar respectively.

With reference to FIGS. 7 and 8, a motor controller 300 is shown. Motor controller 300 is similar to motor controller 100, and additionally includes a cold plate 350. Cold plate 350 is configured and adapted to provide a flow of coolant to housing 312, thereby removing heat generated by current flowing through PCB 322 and bus bar 316. Cold plate 350 may form a substrate upon which motor controller 300 is constructed. Alternatively, cold plate 350 can be formed using the same additive manufacturing process from which housing body 312 is constructed. As will be appreciated by those skilled in the art, motor controllers having fins, cold or both are contemplated and within the scope of the present disclosure.

Utilizing additive manufacturing to build up the housing body around the bus bar allows for constructing a housing body that is integral with the bus bar. This directly integrates the bus bar into the housing, such as through the insulating body. The embedded bus bar can then connect to other components embedded in the housing or connect to standoffs to which other components connect. This eliminates the need for duplicate mounting structures or wires within the housing.

Using additive manufacturing to integrally form the housing body with the bus bar and/or the insulating body allows for forming a complex shape. This can reduce the volume occupied by the motor controller. It can also enable fabrication of controller assemblies using different materials, such as insulators and conductors. This allows for construction of devices such as motor controllers where the components within the housing body are integral with one another, such as by building a first part of the housing body from a substrate, e.g. a cold plate, inserting a PCB, and constructing a second part of the housing body thereafter.

Embedding the bus bar within the housing bodies provides improved cooling of the bus bar and components connected to the bus bar. Specifically, because the bus bar is in intimate mechanical contact of the insulating body, and housing body is in intimate mechanical contact with the housing body, heat transfers readily from the bus bar to the environment external to the housing body through the insulating body. This is particularly advantageous in bus bars subject to large current changes, such bus bars located in motor controllers for aircraft starter generators for example.

Connecting components such as PCBs provides simpler and cleaner assembly of motor controllers. Specifically, because the PCB mechanically couples to the bus bar through a standoff that also provides an electrical connection between the PCB, fewer standoffs or mounting connections are necessary within the housing. This also provides for housing with fewer internal wires because the standoff functions as both a PCB mounting structure and an electrical connection of the PCB, eliminating the need for a separate wire to connect the PCB to the bus bar. It further reduces the likelihood that foreign objects can contact with the bus bar when it is in an energized state.

The methods and systems of the present disclosure, as described above and shown in the drawings, provide housings for electrical assemblies with superior properties including simplified and improved mounting for electronic components and subassemblies within the housings. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. A housing for electrical components, comprising:
   a housing body;
   an insulating body disposed in and integral with the housing body; and
   a bus bar embedded in the insulating body and integral with the housing body, the insulating body electrically insulating the bus bar from the housing and fixing bus bar within the housing,
   wherein the housing includes a two or more interleaved foils interconnected to one another by a weld.

2. A housing as recited in claim 1, wherein the housing body and the bus bar define respective standoffs for coupling electrical components in the housing.

3. A housing as recited in claim 1, further including a cooling body connected to the housing body.

4. A housing as recited in claim 3, wherein the cooling body is finned structure configured for cooling the housing using a gaseous coolant flow.

5. A housing as recited in claim 3, wherein the coolant body is a cold plate configured for cooling the housing using a liquid coolant flow.

6. A housing as recited in claim 1, further including a printed wire board disposed within and coupled to the housing body.

7. A housing as recited in claim 6, further including a standoff embedded in the housing body and coupling the printed wire board to the housing body.

8. A housing as recited in claim 1, further including an inductor body embedded within a cavity defined by at least one of the housing body and insulating body.

9. A housing as recited in claim 8, wherein the inductor body is a C-shaped, E-shaped, Torrid or other shaped inductor.

10. A housing as recited in claim 8, further including a conductor connected to the bus bar and winding about the inductor body.

11. A motor controller, comprising:
    a housing as recited in claim 1;

a printed wire board disposed within the housing body;

a standoff electrically connecting the printed wire board to the bus bar, wherein the standoff mechanically couples the printed wire board to the housing body through the bus bar and insulating body; and wherein the insulating body thermally connects the bus bar to the housing body for cooling the bus bar.

12. A motor controller as recited in claim 11, wherein the housing body and insulating body are integrally formed using an additive manufacturing process.

13. A housing for electrical components, comprising:

a housing body;

an insulating body disposed in and integral with the housing body; and a bus bar embedded in the insulating body and integral with the housing body, the insulating body electrically insulating the bus bar from the housing and fixing bus bar within the housing; and a standoff embedded in the bus bar and coupling the printed wire board to the housing body.

14. A housing as recited in claim 13, wherein the standoff electrically connects the printed wire board to the bus bar.

15. A housing as recited in claim 13, wherein the standoff couples the printed wire board to the housing body through the insulating body.

16. A motor controller, comprising:

a housing as recited in claim 7;

a printed wire board disposed within the housing body; and a standoff electrically connecting the printed wire board to the bus bar, wherein the standoff mechanically couples the printed wire board to the housing body through the bus bar and insulating body, wherein the insulating body thermally connects the bus bar to the housing body for cooling the bus bar, and wherein the housing includes a two or more interleaved foils interconnected to one another by a weld.

* * * * *